(12) United States Patent
Senba et al.

(10) Patent No.: US 6,188,127 B1
(45) Date of Patent: *Feb. 13, 2001

(54) SEMICONDUCTOR PACKING STACK MODULE AND METHOD OF PRODUCING THE SAME

(75) Inventors: Naoji Senba; Yuzo Shimada; Kazuaki Utsumi; Kenichi Tokuno; Ikushi Morizaki; Akihiro Dohya; Manabu Bonkohara, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/604,115

(22) Filed: Feb. 20, 1996

(30) Foreign Application Priority Data

Feb. 24, 1995 (JP) .................................................. 7-036664

(51) Int. Cl.⁷ ..................................................... H01L 23/02
(52) U.S. Cl. ........................... 257/686; 257/685; 257/723; 257/698; 257/778
(58) Field of Search ..................... 257/685, 686, 257/698, 700, 706, 707, 723, 724, 778

(56) References Cited

U.S. PATENT DOCUMENTS

| 4,894,706 | * | 1/1990 | Sato et al. .............................. 257/686 |
| 4,953,005 | * | 8/1990 | Carlson et al. ...................... 257/686 |

(List continued on next page.)

FOREIGN PATENT DOCUMENTS

| 6-333983 | 1/1982 | (JP) . |
| 61-101067 | 5/1986 | (JP) . |

(List continued on next page.)

OTHER PUBLICATIONS

Susumu Kayama and Kunihiko Naruse, "Practical Application Seminar on VSLI Packaging TechnologiesII", Nikkei BP Publications, May 31, 1993 pp. 200–209 (–Exhibit A2. Please refer to Fig. 15.3.1 and Fig. 15.3.5, etc.).

Japan Electronics Society, "IC Mounting Technologies", Kogyo Chosakai Publishing, Jan. 25, 1981, p. 142 (=Exhibit No. 7. Please refer to Fig. 6.5, etc.).

Japanese Office Action dated Sep. 12, 2000 with relevant material enclosed with a wavy line and English translation thereof.

Japanese Office Action dated May 9, 2000 and cited references as follows: (1)Kokai No. 6–13541; (2) Article "A Practical Course on VLSI Packaging Technologies: Part II", Susumu Kayama (ed.), Nikkei BP Co., Ltd., May 31, 1993, pp. 200–209; (3) Kokai No. 2–179385; (4) Kokai No. 2–179387; (5) Kokai No. 2–179388; (6) Article (Niosaka, Improving the Performance of Chip–On–Board Substrates: Electronic Technologies, Mar. 1989, pp. 81–87); (7) Industrial Survey, "IC Mounting Technologies", Jan. 25, 1981; English translation of wavy lined material.

*Primary Examiner*—Sheila V. Clark
(74) *Attorney, Agent, or Firm*—Laff, Whitesel & Saret, Ltd.

(57) ABSTRACT

In a semiconductor package stack module, an LSI (Large Scale Integrated circuit) is mounted, via fine bumps, on a ceramic carrier substrate or a flexible carrier film on which wiring conductors are formed. After a seal resin has been injected, the chip is thinned by, e.g., grinding. A plurality of such carrier substrates or carrier films are connected to each other by bumps via through holes which are electrically connected to the wiring conductors, thereby completing a tridimensional stack module. The module achieves a miniature, thin, dense, low cost, and reliable structure without resorting to a wire bonding system or a TAB (Tape Automated Bonding) system. In addition, the module has a minimum of wiring length and a desirable electric characteristic.

12 Claims, 9 Drawing Sheets

U.S. PATENT DOCUMENTS

| | | | | |
|---|---|---|---|---|
| 5,237,204 | * | 8/1993 | Val | 257/698 |
| 5,343,366 | * | 8/1994 | Cipolla et al. | 257/686 |
| 5,376,825 | * | 12/1994 | Tukamoto et al. | 257/685 |
| 5,594,275 | * | 1/1997 | Kwon et al. | 257/685 |
| 5,608,265 | * | 3/1997 | Kitano et al. | 257/685 |

FOREIGN PATENT DOCUMENTS

| | | |
|---|---|---|
| 2-179385 | 7/1990 | (JP) . |
| 2-310957 | 12/1990 | (JP) . |
| 3-194954 | 8/1991 | (JP) . |
| 3-295265 | 12/1991 | (JP) . |
| 5-74985 | 3/1993 | (JP) . |
| 5-198708 | 8/1993 | (JP) . |
| 5-251451 | 9/1993 | (JP) . |
| 5-291480 | 11/1993 | (JP) . |
| 5-329681 | 12/1993 | (JP) . |
| 6-13541 | 1/1994 | (JP) . |
| 6-118129 | 4/1994 | (JP) . |
| 6-151631 | 5/1994 | (JP) . |
| 6-216276 | 8/1994 | (JP) . |
| 6-232608 | 8/1994 | (JP) . |
| 6-244056 | 9/1994 | (JP) . |
| 6-275774 | 9/1994 | (JP) . |
| 6-302760 | 10/1994 | (JP) . |
| 57-4127 | 12/1994 | (JP) . |
| 7-29764 | 1/1995 | (JP) . |

\* cited by examiner

FACE-DOWN BONDING

SEALING WITH RESIN

GRINDING OR THE LIKE

FORMING BUMPS

STACKING

FACE-DOWN BONDING

SEALING WITH RESIN

GRINDING OR THE LIKE

STACKING

SEMICONDUCTOR PACKING STACK MODULE AND METHOD OF PRODUCING THE SAME

BACKGROUND OF THE INVENTION

The present invention relates to a semiconductor package with an LSI (Large Scale Integrated circuit) mounted thereon, and a method of producing the same. More particularly, the present invention is concerned with a semiconductor package stack module having LSI chips stacked tridimensionally in a high density, and a method of producing the same.

Various stack module structures for semiconductor packages and methods for producing them are known in the art, as follows.

(1) TSOPs (Thin Small Out line Packages) or similar mold packages are stacked and connected together by leads extending out from the packages (Prior Art 1).

(2) LSI chips are directly stacked together (Prior Art 2). This kind of scheme uses wire bonding, and therefore provides the ends of the chips with a configuration suitable for bonding. The chips are mounted on a carrier substrate a n d connected to the substrate by wires.

(3) Chips connected by TAB (Tape Automated Bonding) are stacked in a module configuration (Prior Art 3). In this case, TAB leads are bent and connected to a carrier substrate.

(4) Semiconductor elements connected by TAB are connected to the islands of a lead frame in a stack, and the entire assembly is sealed by a resin (Prior Art 4).

(5) Japanese Patent Laid-Open Publication No. 61-101067 discloses a memory module structure (Prior Art 5). Specifically, memory ICs are mounted on ceramic packages each having a cavity and formed with electrodes for IC connection and electrodes for chip carrier connection. The electrodes for chip carrier connection are electrically connected to the IC and IC electrodes by thin metallic wires, and the resulting subassembly is sealed by a resin. A plurality of carriers each having an electrode pattern on its outer periphery for leading the electrodes to the outside are stacked. Subsequently, the electrode patterns are electrically connected to each other. The chips are connected by wire bonding while the carriers are connected via the outer walls of a carrier container.

(6) Japanese Patent Laid-Open Publication No. 2-310957 teaches a semiconductor device having a conventional mold package which is provided with leads on its opposite sides, top and bottom (Prior Art 6). A plurality of such semiconductor devices are stacked and connected by leads.

(7) Metal for stack connection is formed on the end faces of semiconductor elements by lithography, oxidation, metal forming or similar technology.

(8) A QFP carrying memory semiconductor elements in a multitip configuration is produced. Such QFPs are stacked and connected by the leads of the QFPs.

(9) Conventional IC packages are stacked and connected by subboards and a mother board.

The prior art technologies described above have the following problems.

(1) Prior Art 1 has a problem that each package has a substantial thickness, resulting in an extremely thick module. Because the chips are connected by wire bonding, the molded configuration is too great to promote miniaturization.

(2) Prior Art 2 must bond the chips one by one, and therefore increases the time and cost for production. Moreover, because bare chips are stacked, the individual chip cannot be tested until the entire module has been assembled. In addition, the ends of the chips must be machined for wire bonding.

(3) Although Prior Art 3 allows a test to be effected with the individual TAB chip, mounting the chips one by one increases the cost. Further, the resulting module is bulky. Because the TAB chips are higher in level than ordinary QFP packages when stacked together, a high packing density is not achievable. In addition, TAB makes various kinds of handling, including mounting, difficult.

(4) Prior Art 4 is expensive, and moreover requires strong semiconductor elements due to the TAB connection. Hence, the semiconductor elements must be provided with a certain thickness and cannot be thinned to below about 0.3 mm. As a result, the entire QFP package cannot be reduced in thickness.

(5) Prior Art 5 also relies on wire bonding. This, coupled with the fact that the carrier containers are connected via their outer walls, increases the size of the module and the wiring length. Further, because each chip carrier has a height more than several times as great as as the thickness of the individual semiconductor device before stacking, the module is not feasible for dense packaging. In addition, connecting the semiconductor devices in multiple stages further lowers the packaging density.

(6) Prior Art 6 disposes a semiconductor element in a mold resin in an inclined position. Hence, the thickness of the mold is several times as greater as the total thickness of the semiconductor element and lead frame. This also obstructs dense packaging. Connecting such semiconductor elements in multiple stages further lowers the packaging density.

(7) Prior Art 7 is technically difficult to practice and needs prohibitive facility investments.

(8) Prior Art 8 is not suitable for dense packaging because the individual QFP package is several times as thick as the semiconductor element. Connecting the packages in multiple stages further lowers the packaging density.

(9) Prior Art 9 simply connects IC packages having the conventional thickness in multiple stages, and therefore fails to enhance dense packaging. In addition, the subboards and mother board further lower the packaging density.

SUMMARY OF THE INVENTION

It is therefore an object of the present invention to provide a miniature, thin, dense, low cost, and reliable semiconductor package stack module needing a minimum of wiring length and achieving a desirable electric characteristic, and a method of producing the same.

In accordance with the present invention, a semiconductor package has a carrier, through holes formed in the carrier or at the end faces of the carrier, a conductor pattern formed at least on the front of the carrier, pads for inner bonding, and formed on the rear of the carrier, and electrically connected to the through holes, and an LSI chip connected to the carrier by the pads.

Also, in accordance with the present invention, in a semiconductor package stack module having a plurality of carriers stacked one upon the other, the carriers each has through holes formed in or at the end faces of the carrier, a conductor pattern formed at least on the front of the carrier, pads for inner bonding, and formed on the rear of the carrier, and electrically connected to the through holes, and an LSI chip connected to the carrier by the pads. The carriers are connected tridimensionally by the through holes.

Further, in accordance with the present invention, a method of producing a semiconductor package stack module has the steps of connecting a ceramic carrier substrate and an LSI chip, injecting a seal resin between the ceramic carrier substrate and the LSI chip which are formed with bumps each, reducing the thickness of the LSI chip mounted on the ceramic carrier substrate by one of polishing, grinding, surface grinding, and etching, and stacking and soldering a plurality of ceramic carrier substrates each carrying the respective LSI chip.

Moreover, in accordance with the present invention, in a semiconductor package stack module, a multicarrier body formed with a plurality of carriers not separated from each other is subjected to mounting of LSI chips, connection of the LSI chips and carriers via bumps, sealing with resin, thinning, burn-in tests, multistage connection, and electric characteristic tests, and then the plurality of carriers are separated from each other by one of laser, scribing, dicing, and choco-braking.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENTS

Figure 1:
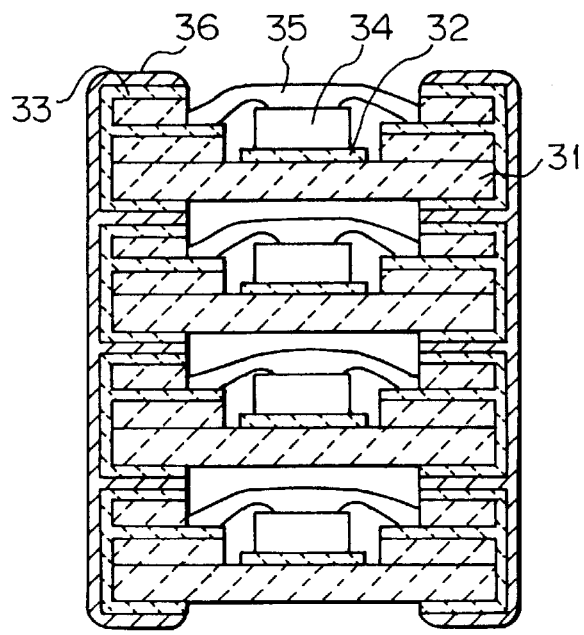
FIGS. 1 and 2A–2B each shows a particular conventional semiconductor package stack module.

To better understand the present invention, a brief reference will be made to a conventional semiconductor package stack module, shown in FIG. 1. As shown, the module has memory ICs 34 mounted on respective ceramic packages. The ceramic packages each has a cavity and is formed with electrodes 32 for IC connection and electrodes 33 for chip carrier connection. The electrodes 33 are electrically connected to the IC 34 and IC electrodes 32 by thin metallic wires, and the resulting subassembly is sealed by a resin 35. A plurality of carriers each having an electrode pattern on its outer periphery for leading the electrodes to the outside are stacked. Subsequently, the electrode patterns are electrically connected to each other. The reference numerals 31 and 36 designate ceramics and a solder, respectively. The chips 34 are connected by wire bonding while the carriers are connected via the outer walls of a carrier container.

Figure 2A:
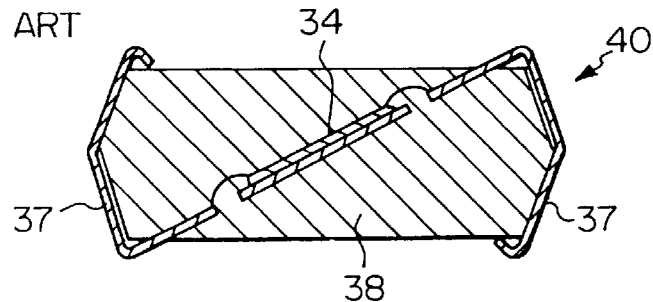
Figure 2B:
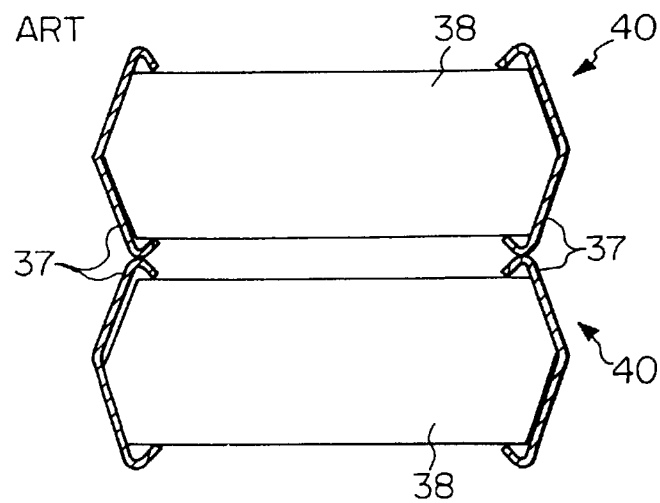

FIGS. 2A and 2B show Prior Art 6 taught in previously mentioned Japanese Patent Laid-Open Publication No. 2-310957. As shown in FIG. 2A, a semiconductor device 40 is produced which has leads 37 on the opposite sides, top and bottom of a package implemented as a molding 38. Then, as shown in FIG. 2B, such semiconductor devices 40 are connected by the leads 37 in multiple stages.

However, the above conventional structures have various problems, as discussed earlier.

Preferred embodiments of the semiconductor package stack module in accordance with the present invention will be described hereinafter. In the embodiments, the same structural parts are designated by like reference numerals.

1st Embodiment

Figure 3A:
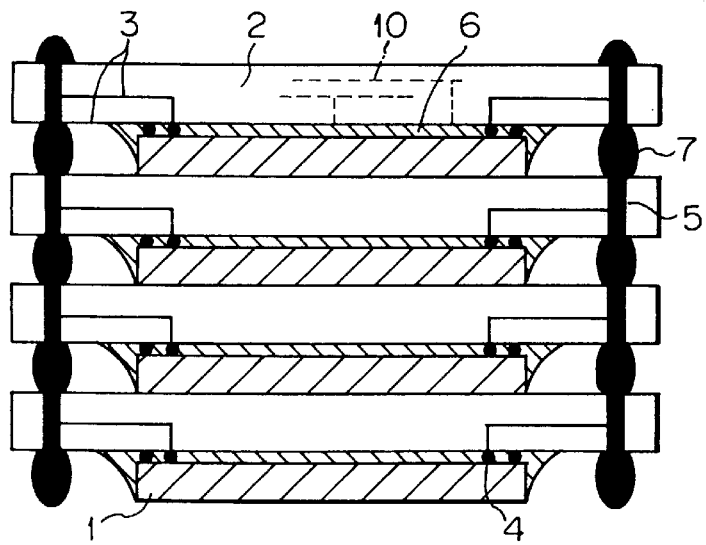
FIGS. 3A–3C show a first and a second embodiment of the semiconductor package stack module in accordance with the present invention.
Figure 3B:
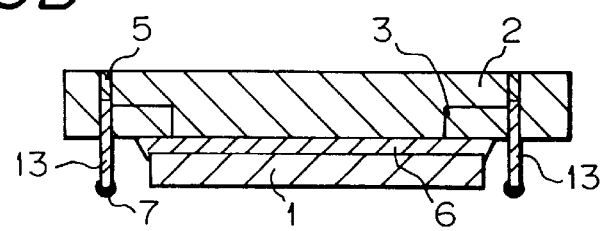
Figure 3C:
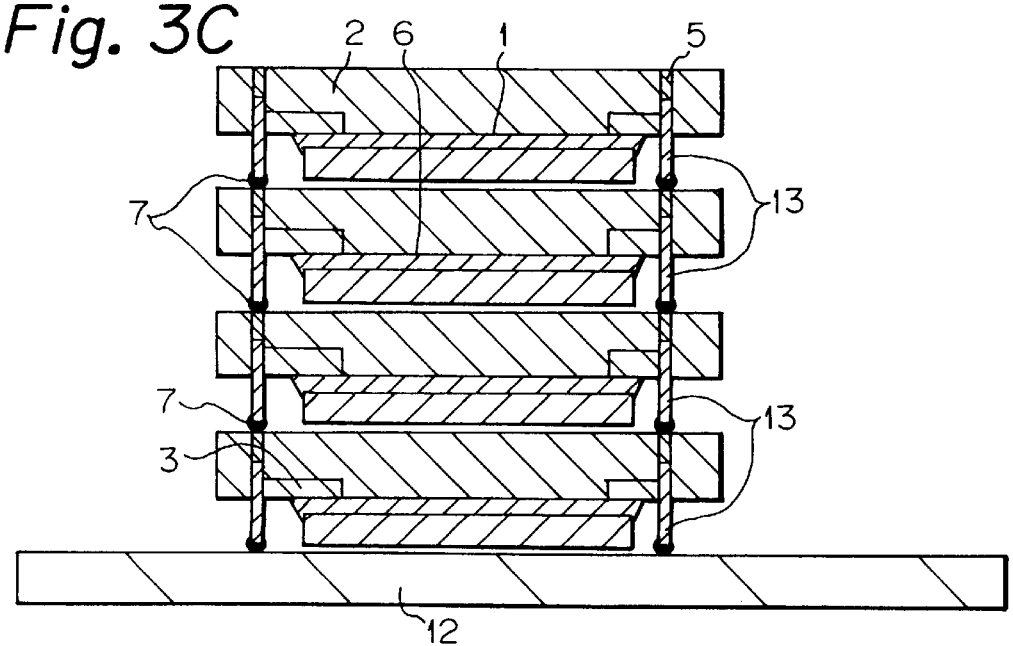

As shown in FIGS. 3A–3C, a semiconductor package stack module has LSI chips 1 implemented as 4M-DRAM chips by way of example. Each chip is sized 4.5 mm×12.0 mm and provided with twenty-six I/O terminals. Ceramic carrier substrates 2 are implemented as 150 $\mu$m thick glass ceramic substrates in the illustrative embodiment. Each carrier substrate 2 is sized 5.0 mm×13.4 mm and has wiring conductors 3 on its surface where the chip 1 is mounted, and in its inside. For the conductors 3, use is made of an Ag-Pd conductive paste. The carrier substrates 2 are formed with through holes 5 in their portions where the substrates 2 are electrically connected to each other. The front and rear of each carrier substrate 2 is connected together by a conductor. Each chip 1 and associated carrier substrate 2 are connected by bumps 4 which are implemented by a Pb-Sn solder. The reference numeral 12 designates a mother board.

Figure 4A:
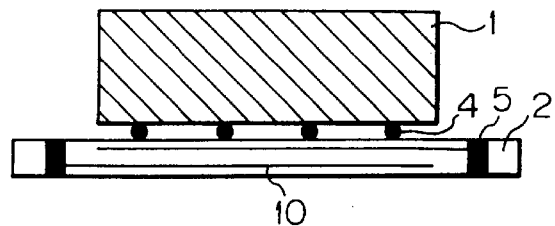
FIGS. 4A–4E show a sequence of steps for producing the module shown in FIGS. 3A–3E.
Figure 4B:
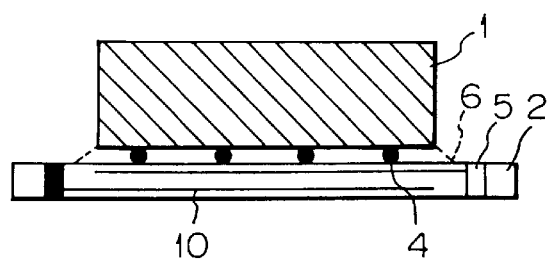
Figure 4C:
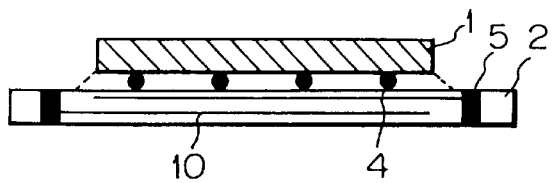

The above stack module was connected by the following procedure. First, the bumps 4 were formed on each chip 1. Then, a solder paste was printed on the pads of the carrier substrate 2, and then the chip 1 was set on the substrate 2. The substrate 2 and chip 1 were connected together by reflow at 230° C. (FIG. 4A). The substrate 2 has a capacitor 10 thereinside. An epoxy resin or seal resin 6 was injected into the above subassembly and then hardened in order to enhance the reliability of the connecting portion and chip 1 (FIG. 4B). The chip 1 was produced from a 0.6 mm thick silicon wafer and ground, polished, surface ground, etched or otherwise treated to a thickness of 0.1 mm (FIG. 4C).

Figure 4D:
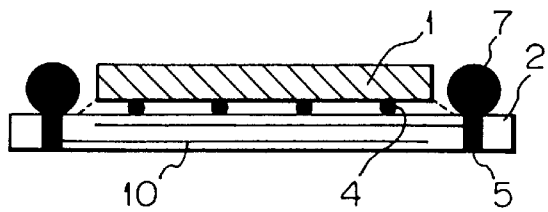
Figure 4E:
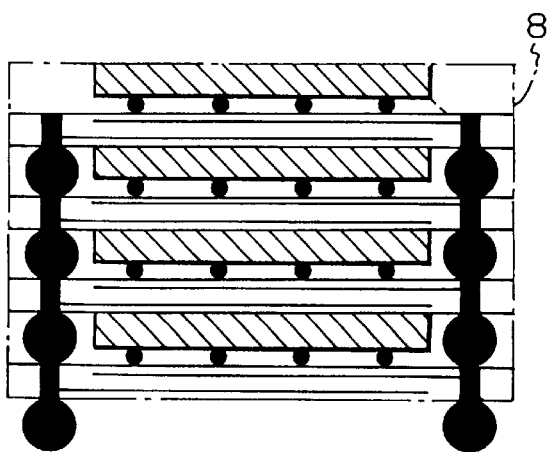

Four carrier substrates 2 each carrying the thinned chip 1 thereon were stacked and electrically connected by bumps 7. The bumps 7 are Cu balls having a diameter of 150 $\mu$m and coated with a Pb-Sn solder. Specifically, the solder paste was printed on the pads of each substrate 2, and then the Cu balls coated with solder were arranged on the substrate 2 and fused by heat to turn out the bumps 7 (FIG. 4D). The solder paste was also printed on the other side of each substrate 2. Subsequently, four substrates 2 were stacked and heated to be thereby connected to each other and then fixed by a resin 8. The resulting stack module is shown in FIG. 4E.

In the illustrative embodiment, the four 4M-DRAMs stacked together implement a 16M-DRAM. Because the thickness of the module is open to choice, the individual semiconductor device can be as thin as 0.1 mm to 0.3 mm.

In the embodiment, the substrates 2 have desirably flat because the warp thereof is 20 $\mu$m or less. In the connecting portions of the substrates 2, an Ag-Pd conductor is plated with Ni and Au in order to enhance the wettability of the solder.

In the embodiment, the substrates 2 are formed of glass ceramics based on lead borosilicate. Alternatively, use may be made of lead borosilicate-based steatite, forsterite, cordierite, mullite or similar insulative glass ceramics, or alumina, mullite, aluminum nitride, silicone nitride or similar ceramics. When the substrates 2 are formed of such strong ceramics, they are substantially free from deformation during assembly. Hence, the stack module is desirable in operability and reliability.

The solder whose major component was Pb-Sn could be replaced with a solder whose major component was Sn-Ag, Sn-Zn, Au or In. Because each material has a particular melting temperature, it is necessary to select an adequate combination of solders, adequate processing temperatures, etc.

While the bumps may also be implemented by the material used for the solder, use may be made of Cu-core balls or Ni-, Fe- or similar metal-core balls. The bumps may even be replaced with conductive pins 13, as shown in FIGS. 3B and 3C.

Further, the chip 1 and substrate 2 and the substrates 2 themselves may be connected by a conductive adhesive. The conductive adhesive may be an epoxy resin containing the particles of Ag, Cu, Au or similar conductive metal.

In FIG. 3A, when alumina, glass ceramics, aluminum nitride or similar material having high thermal conductivity is used, each substrate 2 may be elongated in the right-and-left direction, as viewed in FIG. 3A. This allows the substrates 2 to play the role of cooling fins.

2nd Embodiment

This embodiment is similar to the first embodiment except that carrier films are substituted for the carrier substrates 2. The carrier films were implemented by 100 $\mu$m thick polyimide films sized 5.0 mm×13.4 mm. The Cu wiring conductors 3 were formed on the surface of each carrier film where the chip 1 was mounted.

Four carrier films each having the above configuration and carrying the thinned chip 1 thereon were electrically connected together by the bumps 7, as follows. For the bumps 7, use was made of Cu balls having a diameter of 150 $\mu$m and coated with a Pb-Sn solder. After the paste had been printed on the pads of the front and rear of each film, the Cu balls coated with the solder were arranged on the film. Subsequently, the films were stacked and heated to have the solder thereof melted. As a result, the film were connected together in the form of a module. In the connecting portions of the films, a Cu conductor was plated with Ni and Au in order to enhance the wettability of the solder.

3rd Embodiment

Figure 5A:
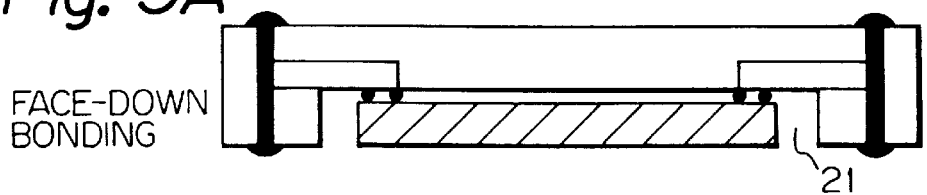
FIGS. 5A–5D show a third and a fourth embodiment of the present invention.

FIG. 5A shows a single carrier substrate although a plurality of such substrates may be stacked to form a stack module. In this embodiment, the substrate was made of alumina and 100 $\mu$m thick, while the wiring conductors were implemented by Mo. As shown, the substrate is formed with a cavity 21 for receiving an LSI chip. The bumps for connecting the chip to the substrate was implemented by an Au-Sn solder. The substrates stacked together were connected to each other by an Sn-Zn solder.

4th Embodiment

Figure 5B:
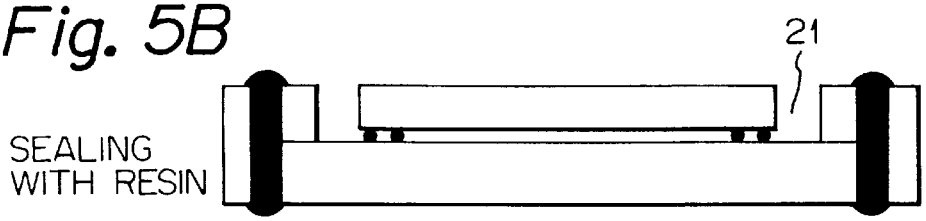

As shown in FIG. 5B, this embodiment is similar to the third embodiment except that a carrier film is substituted for the carrier substrate. The wiring conductors were implemented by Cu. The film was 100 $\mu$m thick in its portion corresponding to the cavity 21, and 250 $\mu$m thick in the other portion.

The carrier with the cavity 21 of the third or fourth embodiment is easy to handle in the event of stacking and protects the chip from damage. This kind of package is highly reliable.

Figure 5C:
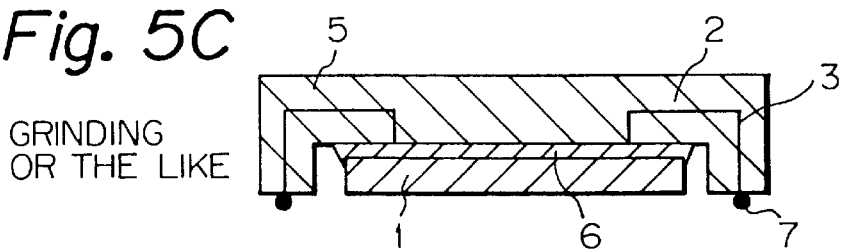
Figure 5D:
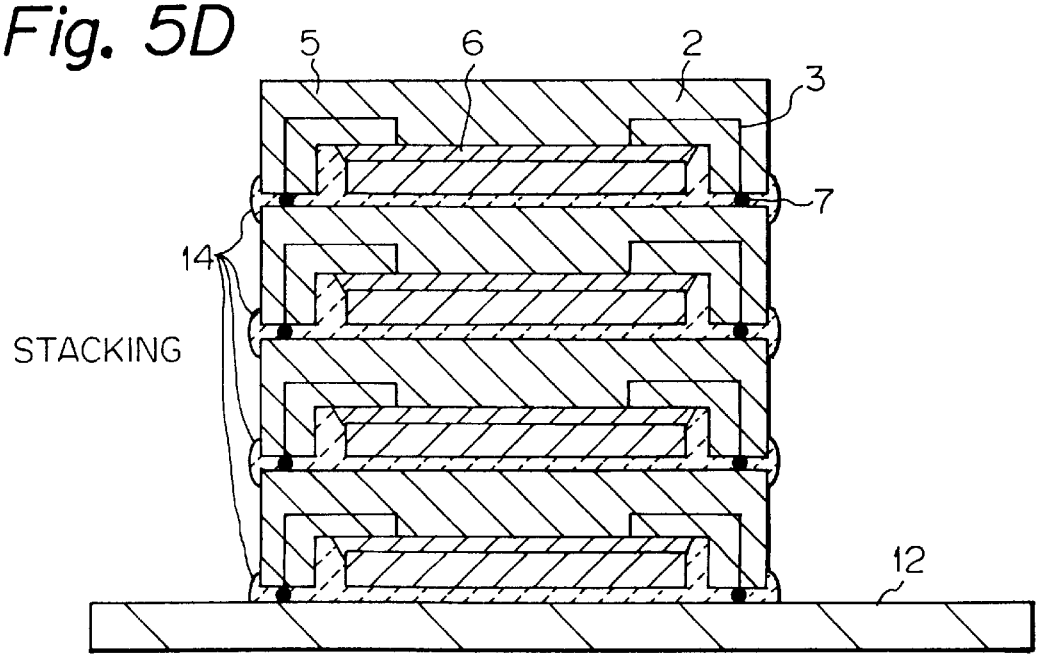

As shown in FIGS. 5C and 5D, the nearby carriers or all the carriers in the stack may be collectively sealed by a nonconductive resin 14, except for the bumps 7 to be connected to the mother board 12. This increases the resistance of the module to moisture. Of course, the nonconductive resin 14 is also applicable to the carriers lacking the cavity.

5th Embodiment

Figure 6:
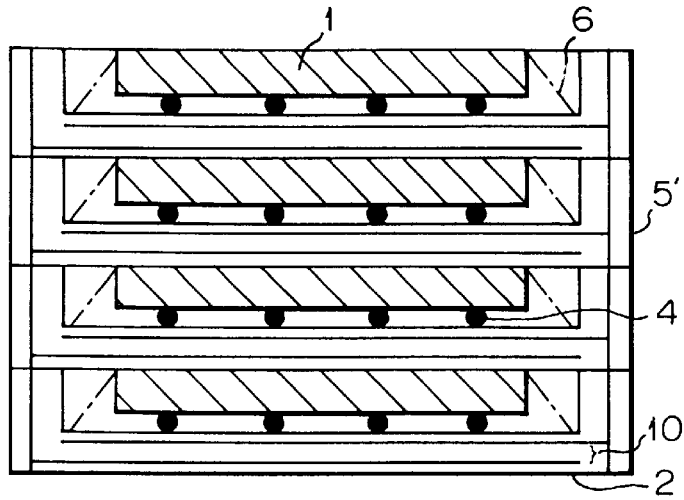
FIG. 6 shows a fifth embodiment of the present invention.
Figure 7A:
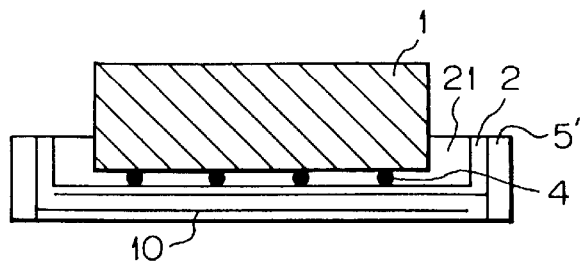
FIGS. 7A–7D demonstrate a sequence of steps for producing the module of the fifth embodiment.
Figure 7B:
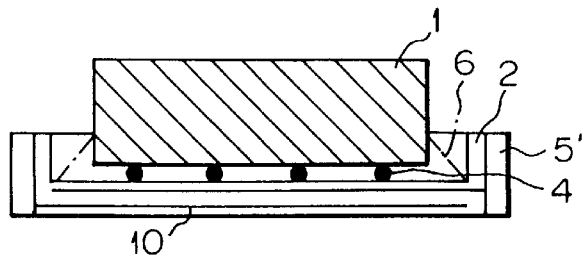
Figure 7C:
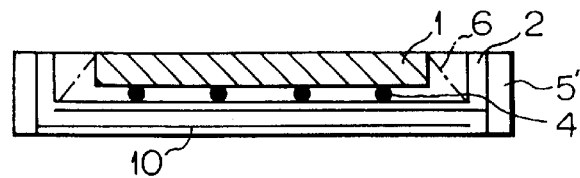
Figure 7D:
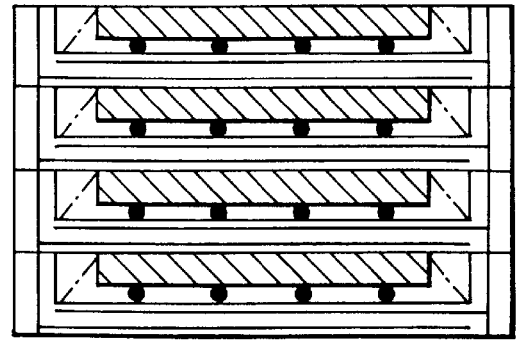

As shown in FIG. 6, this embodiment is similar to the first and second embodiments except that each carrier has a cavity and end through holes 5'. FIGS. 7A–7D show a procedure for assembling the stack of FIG. 6. The LSI chip 1 with metal or bumps 4 is connected face down to the carrier 2 having the cavity 21, and the electrodes of the chip 1 and those of the carrier 2 are electrically connected (FIG. 7A). Then, the subassembly is sealed by the resin 6 (FIG. 7B). Subsequently, the chip 1 has its rear polished, ground, etched or otherwise treated to have a thickness of about 0.1 mm to about 0.3 mm (FIG. 7C). Finally, the carriers are stacked together and connected by metal, conductive resin or the like via the end through holds 5' (FIG. 7D).

In the above procedure, when four carriers are stacked, the entire stack is about 0.4 mm to 1.2 mm thick. While such a thickness is equivalent to 0.1 mm particular to a TSOP which is the thinnest package available today, this embodiment is about four times as high as the TSOP in packaging density and feasible for a high density semiconductor device.

6th Embodiment

Figure 8:
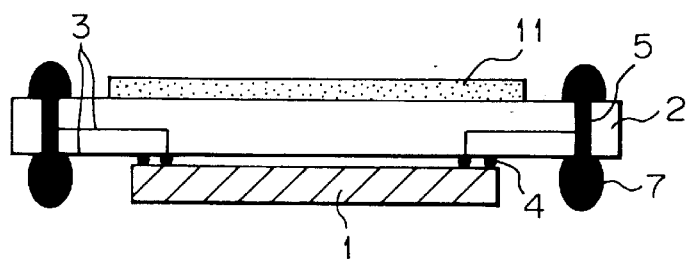
FIG. 8 shows a sixth embodiment of the present invention.

FIG. 8 shows a single carrier substrate 2 although a plurality of such substrates may be stacked to form a stack module. As shown, the LSI chip 1 is bonded to the semiconductor pads of the substrate 2 face down via the bumps 4. The ceramic substrate 2 was 200 $\mu$m thick. Increases in processing speed and packaging density make it necessary to release heat generated by the chip 1 and to match the characteristic impedance. In light of this, in this embodiment, a conductor layer 11 is formed on the side of the substrate 2 opposite to the side for mounting the chip 1. The conductor layer 11 may be implemented as a conductive heat radiator, in which case the layer 11 may be connected to ground. While the conductive layer 11 is W in the embodiment, the above object is achievable even if use is made of metal whose major component is Ag, Au, Cu, Ag-Pd, Mo or the like.

In this embodiment, the ceramic carrier 2 is formed of aluminum nitride. However, the carrier 2 may be formed of any other glass ceramics or ceramics mentioned in relation to the first embodiment. The wiring conductors 3 were based on W. The bumps 4 and 7 were implemented by Ag-core balls coated with an Sn-Ag solder and Au, respectively.

7th Embodiment

Figure 9A:
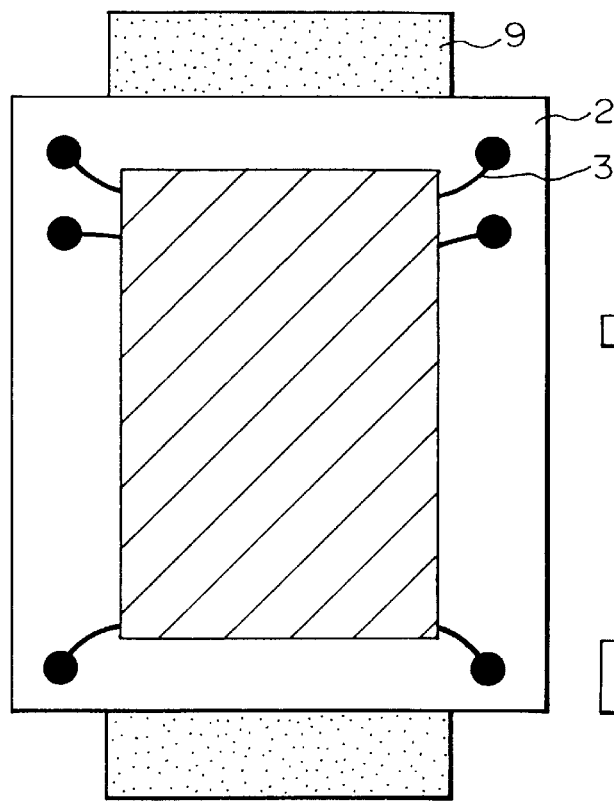
FIGS. 9A–9C show a seventh embodiment of the present invention.
Figure 9B:
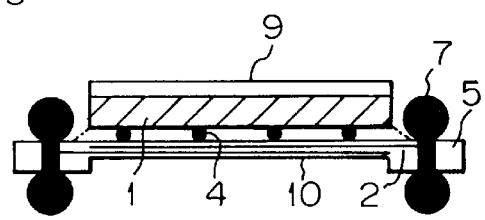
Figure 9C:
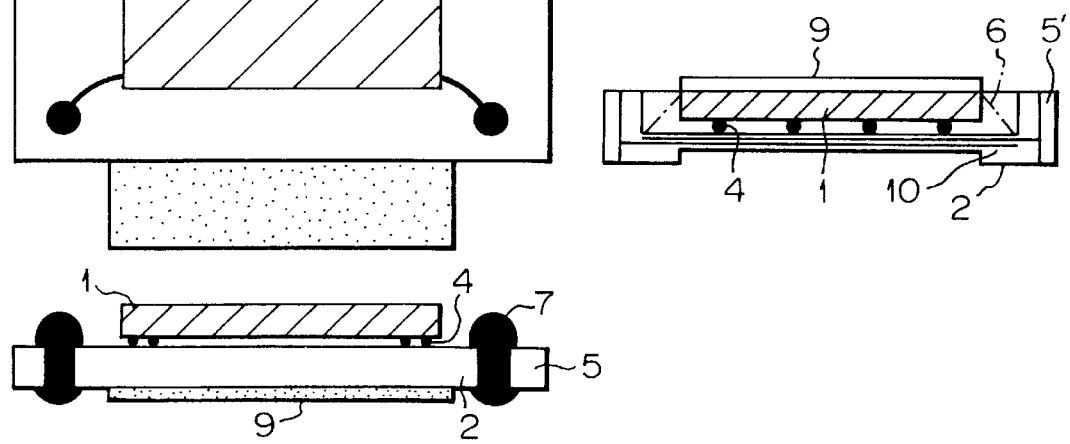

As shown in FIGS. 9A–9C, this embodiment is similar to the sixth embodiment except that the ceramic carrier substrate 2 is replaced with a 50 $\mu$m thick polyimide carrier film 2. To release the heat, a heat radiator 9 is formed on the side of the film 2 opposite to the side for mounting the chip 1. With the heat radiator 9, it is possible to radiate the heat and to match the characteristic impedance for reducing electric noise. The heat radiator, or conductive layer, 9 may be formed in a solid, mesh or similar pattern. While the heat radiator 9 is a copper sheet in the embodiment, use may be made of a sheet of nickel, stainless steel, tungsten, aluminum, molybdenum or similar metal. Further, as shown in FIGS. 9B and 9C, the heat radiator 9 may be bonded by metal or resin having high thermal conductivity to the rear of the individual chip 1 thinned to a desired thickness.

While the wiring conductors 3 were also made of Cu, the bumps 7 and 4 were implemented by Ag-core balls coated with an Sn-Ag solder and Au, respectively. In the pad portions for attaching the bumps 7, a Cu conductor was plated with Ni and Au.

8th Embodiment

Figure 10A:
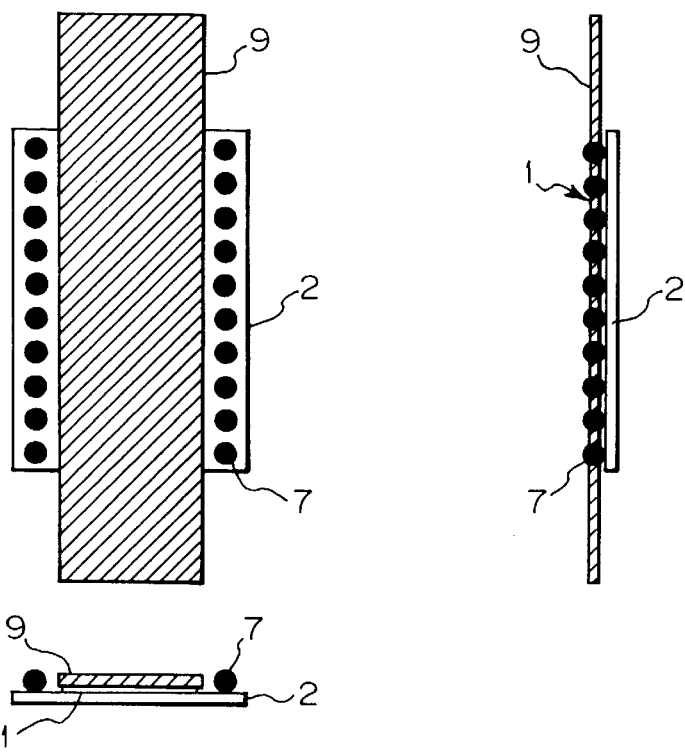
FIGS. 10A and 10B show an eighth embodiment of the present invention.
Figure 10B:
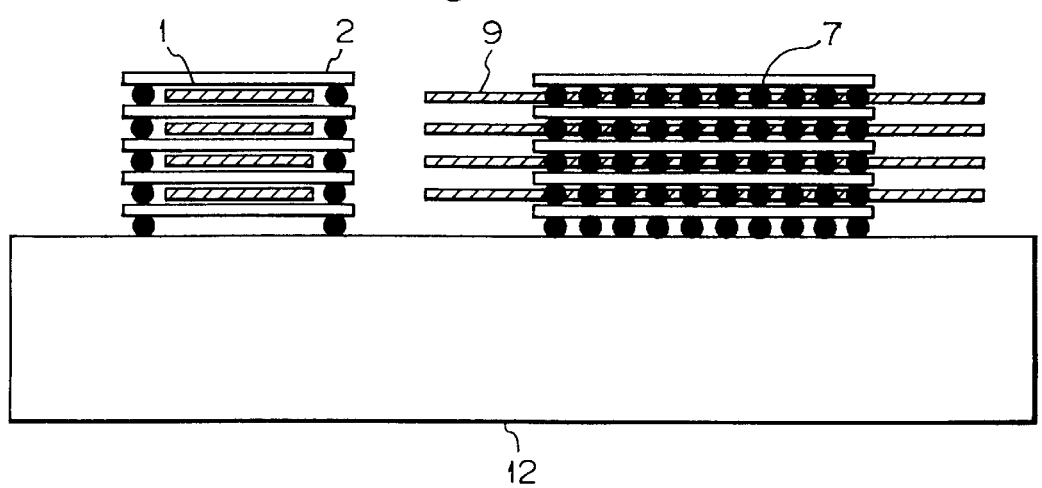

FIGS. 10a and 10B show an embodiment in which the carriers 2 arranged in a stack each has a heat radiating effect. As shown in FIG. 10B, each heat radiator 9 is elongated in order to enhance the heat radiating effect. Because the heat radiating effect of the heat radiator 9 increases with an increase in the thickness of the radiator 9, the distance between the chip 1 and the carrier 2 should preferably be zero. If the distance is not zero, a compound, silicone rubber or oil having high thermal conductivity may be filled in the gap between the chip 1 and the carrier 2.

While FIGS. 10A and 10B show each heat radiator 9 as contacting the rear of the associated chip 1, the heat radiator 9 may, of course, contact the rear of the carrier 2.

9th Embodiment

Figure 11A:
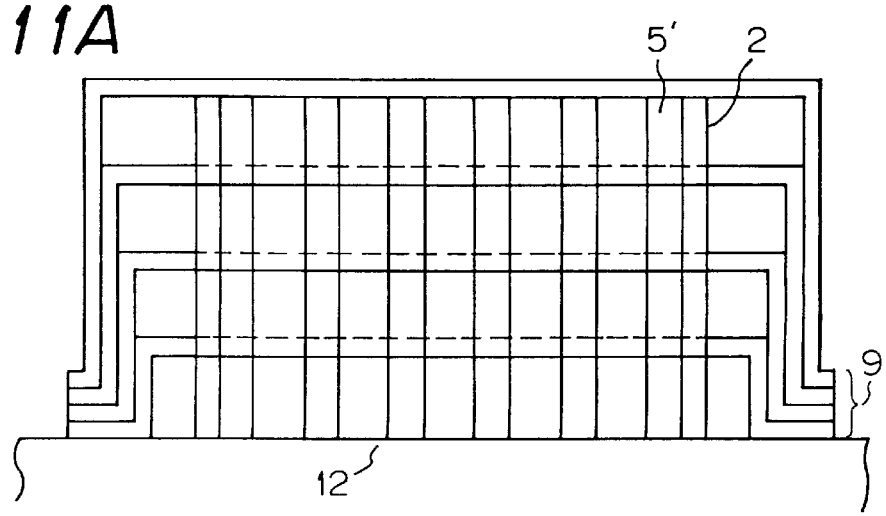
FIGS. 11A and 11B show a ninth embodiment of the present invention.
Figure 11B:
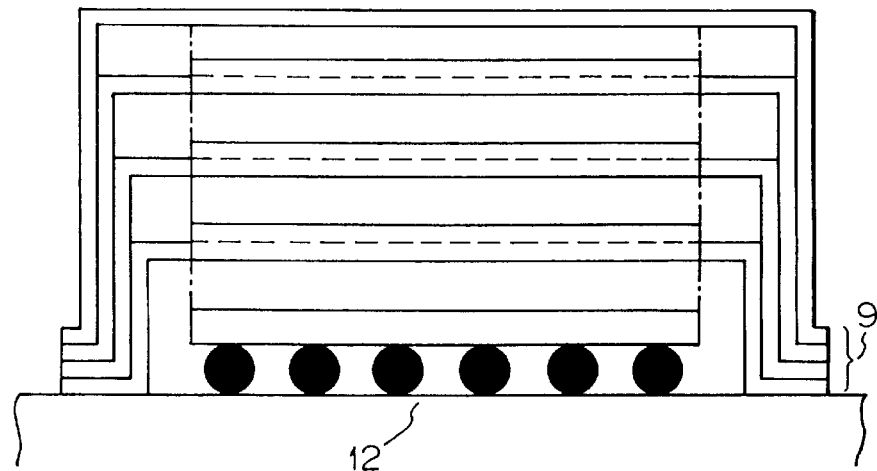

As shown in FIGS. 11A and 11B, the chips 1 each having the respective heat radiator 9 are mounted on the mother board 12. The surface of the heat radiator 9 and the rear of the associated carrier 2 may be bonded by metal or resin having high thermal conductivity, as shown in FIG. 11A, or may be connected together by bumps, as shown in FIG. 11B. This kind of structure implements a semiconductor package stack module having a high density and releasing heat efficiently.

10th Embodiment

Figure 12:
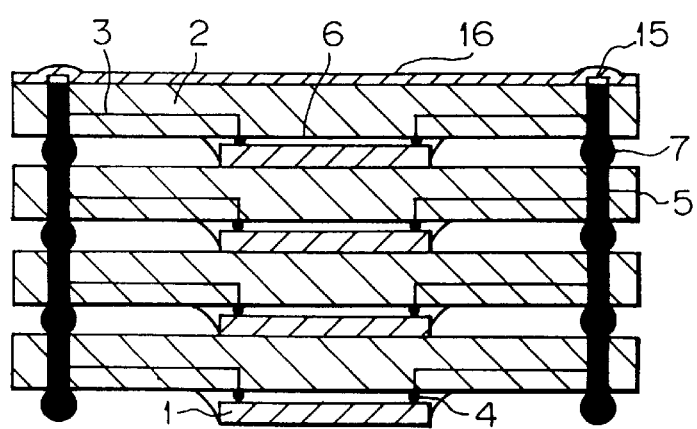
FIG. 12 shows a tenth embodiment of the present invention.

As shown in FIG. 12, electrodes 15 formed on the uppermost carrier substrate 2 are covered with an insulator 16, e.g., a polyimide type sheet. The insulator 16 is provided with an adhesive layer on its one side. In this condition, even when a conductive impurity deposits on any of the electrodes 15, the package is free from short-circuiting. After the stack has been mounted to the mother board, the insulator 16 may be removed in order to use the electrodes 15 as test pads.

11th Embodiment

Figure 13A:
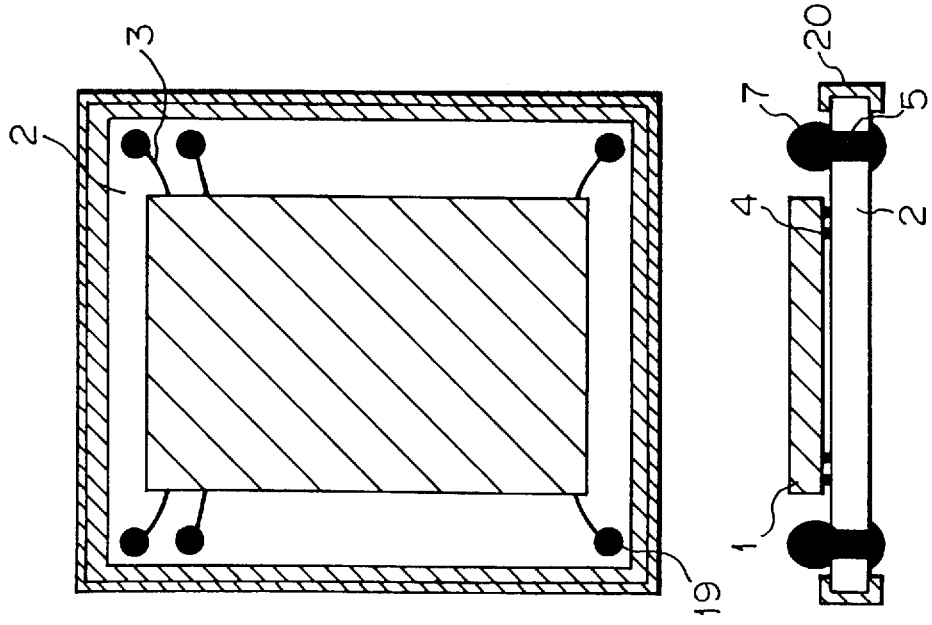
FIGS. 13A and 13B show an eleventh embodiment of the present invention.
Figure 13B:
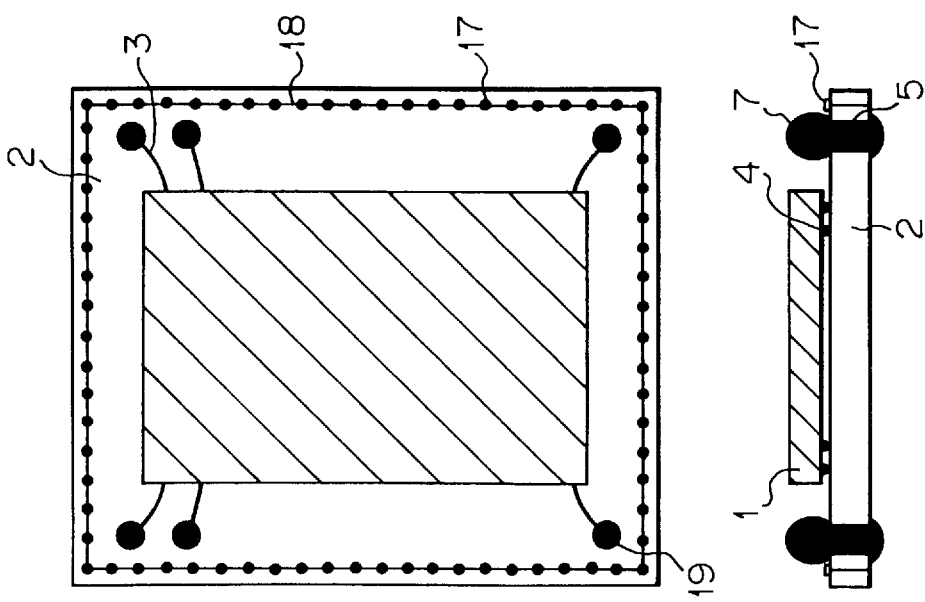

FIG. 13A shows the carrier 2 formed with though holes 17 at a fine pitch, in addition to the through holes 5 adapted for carrier connection. The through holes 17 are interconnected by a conductor 18, and all of them are connected to a ground terminal 19. On the other hand, FIG. 13B shows the carrier 2 provided with a conductive layer 20 along its edges. The conductive layer 20 is connected to the ground terminal 19. The conductive layer 20 surrounds the chip 1 and thereby prevents it from interfering with another chip 1.

12th Embodiment

A multicarrier body is formed with a number of carriers 2 shown in FIGS. 4A–4E or 7A–7D. The chips 1 are connected to the multicarrier body by bumps. Then, the seal resin 6 is injected between each chip 1 and the associated carrier 2. Subsequently, in the multicarrier configuration, the rear of each chip 1 is ground, polished, etched or otherwise treated to provide the chip 1 with a desired thickness.

In the above multicarrier body, the bumps 7 having a desired height are formed by a solder ball method, solder paste printing method, dispensing method, or similar technology.

Terminals extending out from the individual chip 1 to the associated carrier 2 are used to test the electric characteristic before, during, or after a burn-in test. It is to be noted that such a test can be effected at any desired stage after the chips 1 have been mounted on the multicarrier body. A desired number of carriers undergone the above test are positioned. The carriers are connected together by reflow, welding or similar technology when the connection is implemented by metal, or they are connected by thermosetting, ultraviolet rays setting or similar technology when use is made of a conductive resin.

Subsequently, the individual semiconductor device is produced by dicing, laser, scribing, choco-braking, or similar technology. Regarding the choco-braking method, the initial multicarrier body is formed with brake grooves. Finally, an electric characteristic test is performed, as needed. For the test, electrical contact with pads for stack connection and formed on the top, bottom and opposite sides of the individual carrier is set up by a probe or surface-to-surface contact.

While the foregoing embodiments have concentrated on D-RAM chips, the present invention is practicable even with microcomputers, gate arrays and other LSI chips.

In summary, it will be seen that the present invention provides a semiconductor package stack module and a method of producing it which have various unprecedented advantages, as enumerated below.

(1) The module is small size, thin, and dense and has a desirable electric characteristic. Carriers have a minimum of wiring length either individually or in a stack.

(2) A desired number of carrier substrates or carrier films each carrying a respective chip are collectively stacked and connected to form the module. This promotes efficient operations and reduces production cost. The carriers may each have its circuit pattern partly connected or partly separated so as to have a particular circuit function. Then, if a particular symbol or number is provided on each carrier, the electric circuits can be combined in a desired manner.

(3) Because an LSI chip is mounted on the individual carrier substrate or carrier film, the chip can be tested on the carrier basis. Hence, only the acceptable products can be stacked. A desired number of carrier substrates or carrier films each carrying a respective chip are collectively stacked and connected to form the module. This promotes efficient operations and reduces production cost. In addition, bumps for chip connection can be implemented by a solder having a high melting point.

(4) The package releases heat in a desirable manner and has a matched characteristic impedance.

(5) When ceramic carriers are used, the substrates are desirably flat and resistive to moisture. Further, the ceramic carriers are easy to handle during assembly. Moreover, this kind of carriers promote reliable connection because their surfaces remain flat during the course of reflow.

Various modifications will become possible for those skilled in the art after receiving the teachings of the present disclosure without departing from the scope thereof.

What is claimed is:

1. A semiconductor package stack module comprising:
a plurality of carriers stacked one upon the other, each of said plurality of carriers having first through holes associated with said carrier;
a conductor pattern on at least a front face of said carrier and electrically connected to said first through holes;
pads for inner bonding on a rear face of said carrier, and electrically connected to said first through holes;
an LSI chip mounted face down on said carrier and connected thereto by said pads, said plurality of carriers being connected tridimensionally by said first through holes,
wherein first said through holes are formed in said carriers, said plurality of carriers being electrically and tridimensionally connected to each other by bumps formed on said through holes;
further comprising second through holes formed in fine pitch arrays in the edge of each of said carriers portions of said carrier; and
said second through holes being connected to ground without exception.

2. A module as claimed in claim 1, wherein said pads for inner bonding comprise bumps.

3. A module as claimed in claim 2, wherein said pads for inner bonding and said bumps for carrier connection are formed of a solder whose major component is selected from a group consisting of Pb—Sn, Sn—Ag, Sn—Zn, Au—Sn, Au, or In.

4. A module as claimed in claim 1, further comprising a heat radiator interposed between said LSI chip mounted on any one of said plurality of carriers and another carrier adjoining said one carrier, and closely contacting said carrier or said LSI chip.

5. A module as claimed in claim 4, further comprising a conductor pattern closely contacting said carrier.

6. A module as claimed in claim 5, further comprising a material having high thermal conductivity and being interposed between one of said LSI chip and said carrier and said heat radiator.

7. A module as claimed in claim 1, wherein a seal resin is filled between each LSI chip subjected to inner connection and an associated one of said carriers.

8. A module as claimed in claim 1, wherein each of said carriers accommodates a capacitor therein.

9. A module as claimed in claim 8, wherein said capacitor is electrically connected to a power source and ground.

10. A module as claimed in claim 1, wherein said carrier comprises one item selected from a group consisting of a film-like substrate of sintered ceramics, a flexible film, and a printed circuit board.

11. A module as claimed in claim 1, further comprising an insulator covering terminal electrodes formed on a front of an uppermost carrier.

12. A module as claimed in claim 1, further comprising a conductor layer formed on and along edge portions of said carrier and connected to ground.

* * * * *